(12) United States Patent
Schwarz

(10) Patent No.: US 11,503,747 B2
(45) Date of Patent: Nov. 15, 2022

(54) HEAT TRANSFER DEVICE AND COMPONENT

(71) Applicant: Siemens Aktiengesellschaft, Munich (DE)

(72) Inventor: Florian Schwarz, Fürth (DE)

(73) Assignee: SIEMENS AKTIENGESSSCHAFT, Munich (DE)

( * ) Notice: Subject to any disclaimer, the term of this patent is extended or adjusted under 35 U.S.C. 154(b) by 0 days.

(21) Appl. No.: 17/602,589

(22) PCT Filed: Mar. 3, 2020

(86) PCT No.: PCT/EP2020/055575
§ 371 (c)(1),
(2) Date: Oct. 8, 2021

(87) PCT Pub. No.: WO2020/207669
PCT Pub. Date: Oct. 15, 2020

(65) Prior Publication Data
US 2022/0151116 A1    May 12, 2022

(30) Foreign Application Priority Data
Apr. 9, 2019  (EP) .................... 19168170

(51) Int. Cl.
*G06F 1/16* (2006.01)
*H05K 5/00* (2006.01)
(Continued)

(52) U.S. Cl.
CPC ..... *H05K 7/20936* (2013.01); *H05K 7/20327* (2013.01)

(58) Field of Classification Search
CPC ........... H05K 7/20936; H05K 7/20327; H05K 7/2099; H05K 7/20881; H05K 7/208;
(Continued)

(56) References Cited

U.S. PATENT DOCUMENTS 5,441,102 A * 8/1995 Burward-Hoy ....... H01L 23/473
257/E23.098
5,495,889 A * 3/1996 Dubelloy .............. H01L 25/117
361/689
(Continued)

FOREIGN PATENT DOCUMENTS

WO    WO 0195688 A1    12/2001

OTHER PUBLICATIONS

Manfred Groll et al: "State of the Art on Pulsating Heat Pipes."; International Conference on Microchannels and Minichannels; Jun. 19, 2004 (Jun. 19, 2004); Seiten 33-44; XP055693115; Rochester, New York, USA; DOI: https://doi.org/10.1115/ICMM2004-2318.
(Continued)

*Primary Examiner* — Anthony M Haughton
(74) *Attorney, Agent, or Firm* — Henry M. Feiereisen LLC

(57) ABSTRACT

A heat transfer apparatus includes a heat chamber and a heat dissipating structure coupled to the heat chamber so as to jointly form a closed thermal circuit. The heat dissipating structure includes an outlet channel that leads off from the heat chamber and issues at an end that is remote from the heat chamber into a return duct which issues into the heat chamber. The return duct has a dimension which is smaller than a dimension of the outlet channel. The heat chamber is a boiling chamber or a steam chamber and the heat dissipating structure is a channel structure having steam regions and fluid regions. The heat chamber and the heat dissipating structure together form a pulsating or oscillating heating structure mechanism.

15 Claims, 5 Drawing Sheets

(51) Int. Cl.
 *H05K 7/00* (2006.01)
 *H05K 7/20* (2006.01)
(58) Field of Classification Search
 CPC ........... H05K 7/20809; H05K 7/20818; H05K 7/20827; H05K 7/20663; H05K 7/20672; H05K 7/20681; H05K 7/2069
 See application file for complete search history.

(56) References Cited

U.S. PATENT DOCUMENTS

| | | | |
|---|---|---|---|
| 5,937,936 A * | 8/1999 | Furukawa | F28D 15/0233 174/15.2 |
| 6,957,692 B1 | 10/2005 | Win-Haw et al. | |
| 2008/0115916 A1 | 5/2008 | Schuette | |
| 2012/0153325 A1 | 6/2012 | Paschkewitz et al. | |

OTHER PUBLICATIONS

Shanglong Xu et al.: "Heat transfer performance of a fractal silicon microchannel heat sink subjected to pulsation flow"; in: International Journal of Heat and Mass Transfer 81, 2015, pp. 33-40; journal homepage: www.elsevier.com/locate/ljhmt; 2015.

Shanglong Xu et al: "Heat transfer performance of a fractal silicon microchannel heat sink subjected to pul sation flow". International Journal of Heat and Mass Transfer, Pergamon Press, GB, vol. 81, Seiten 33-40, XP029097668, ISSN: 0017-9310, DOI:10.1016/J.IJHEATMASSTRANSFER.2014.10.002; Abstract; 2014.

Kelly Brian et al: "A Study of thermal performance in novel radial pulstating heat-pipe systems", 2017 16th IEEE Intersociety Conference on Thermal and Thermomechanical Phenomena in Electronic Systems (ITHERM), IEEE, pp. 593-599, XP033129270, DOI: 10.1109/ITHERM.2017.7992540; [gefunden am Jul. 25, 2017]; Abstract, Figure 1; 2017.

Kelly Brian et al: "Novel radial pulsating heat-pipe for high heat-flux thermal spreading"; International Journal of Heat and Mass Transfer; Elsevier; Amsteram, NL; Bd. 121; Jan. 4, 2018 (Jan. 4, 2018); Seiten 97-106; XP085366087; ISSN: 0017-9310.

PCT International Search Report and Written Opinion of the International Searching Authority dated May 25, 2020 corresponding to PCT International Application No. PCT/EP2020/055575 filed Mar. 3, 2020.

* cited by examiner

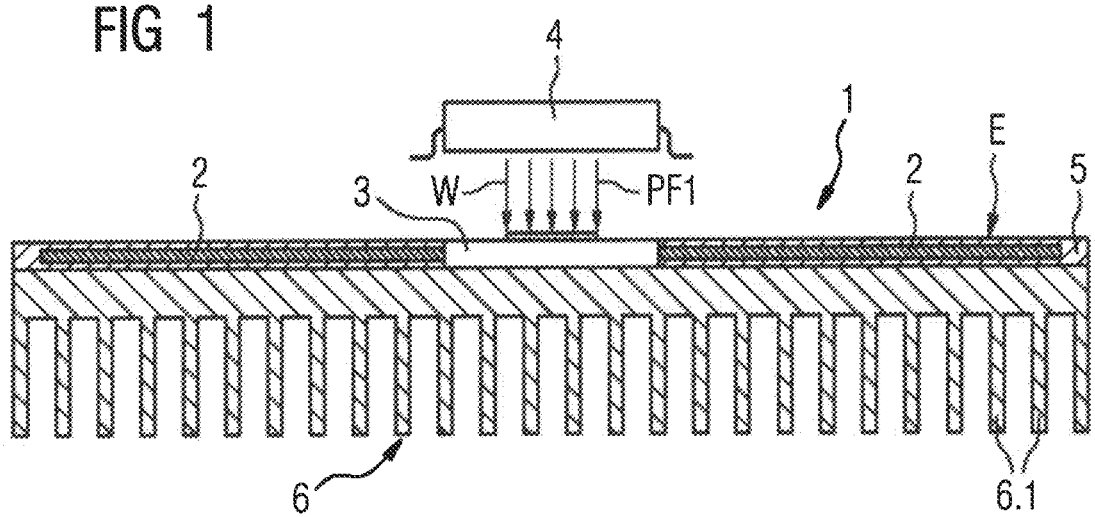
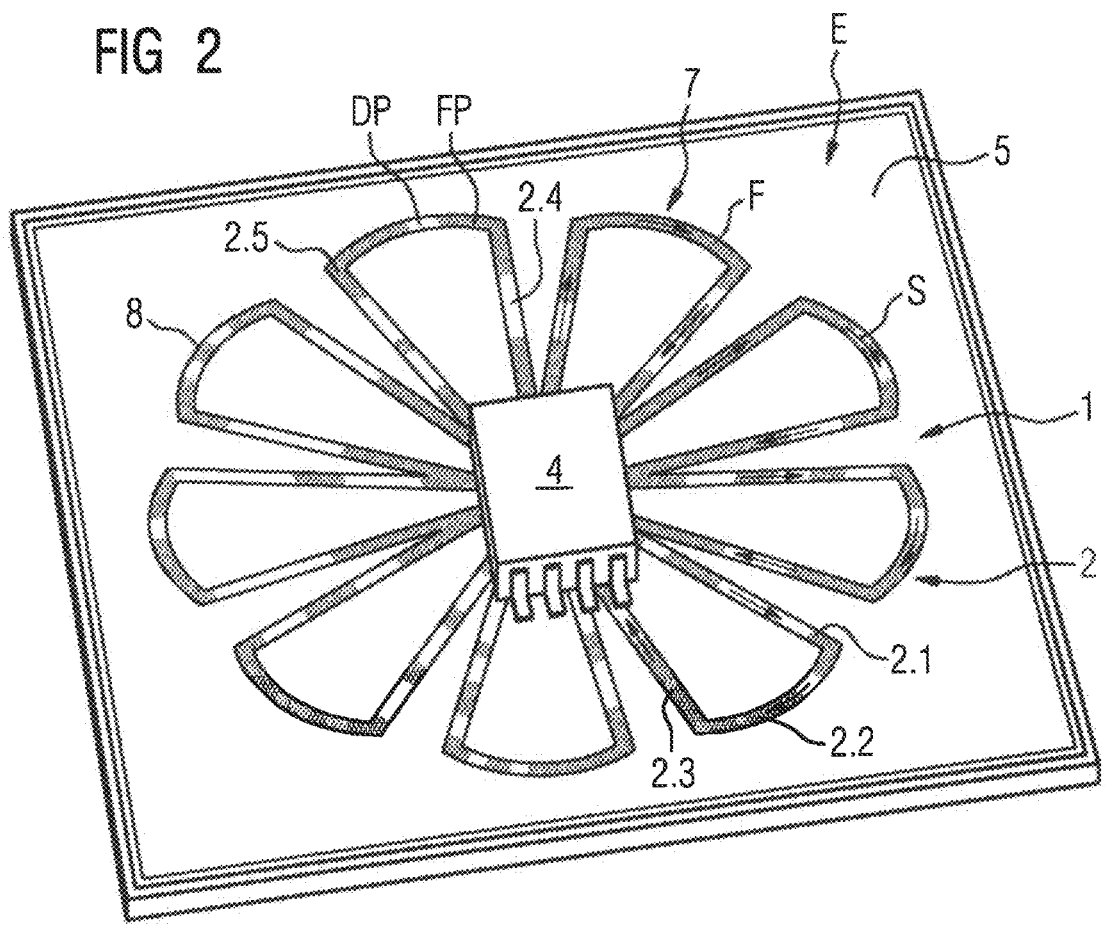

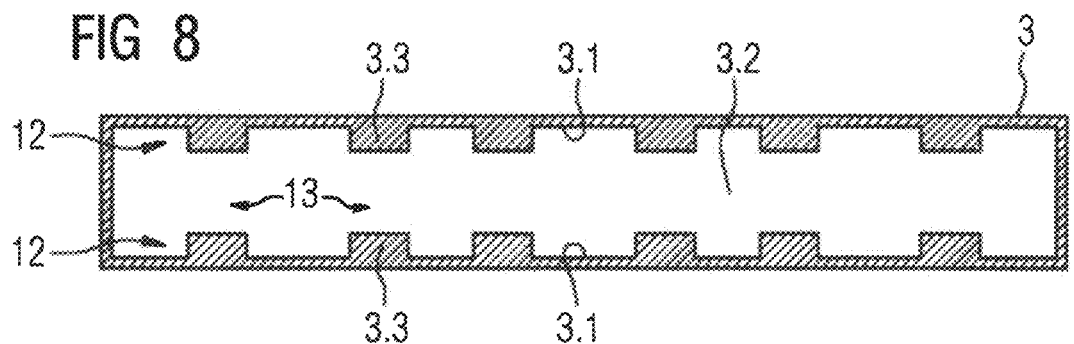
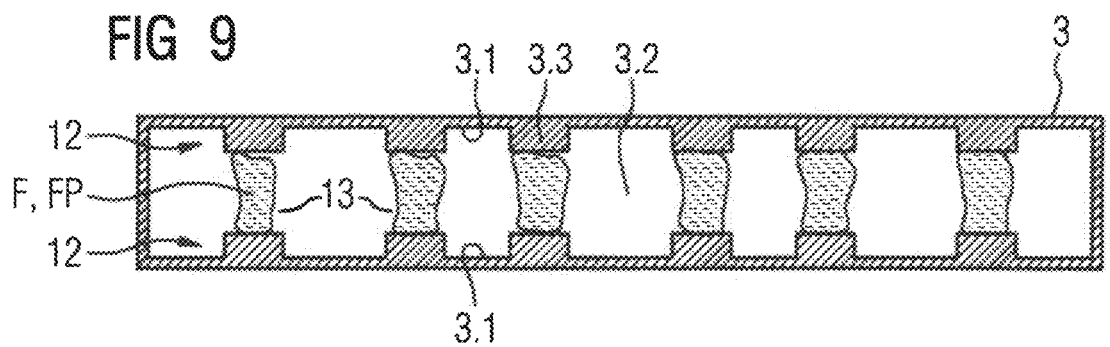
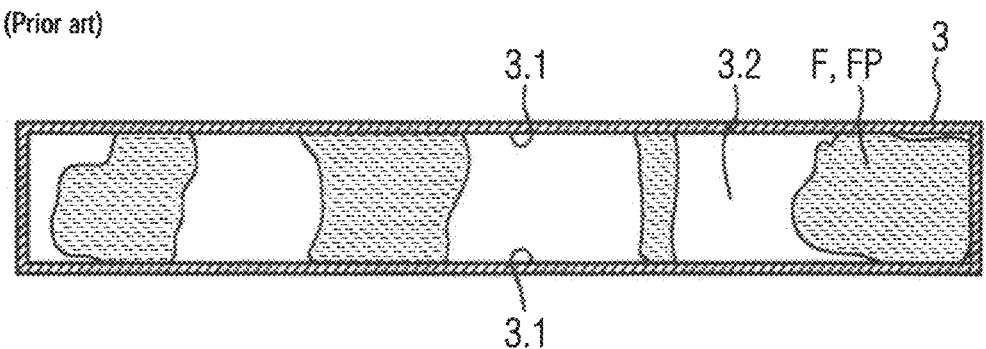

ND COMPONENT

CROSS-REFERENCES TO RELATED APPLICATIONS

This application is the U.S. National Stage of international Application No. PCT/EP2020/055575, filed Mar. 3, 2020, which designated the United States and has been published as International Publication No, WO 2020/207669 A1 and which claims the priority of European Patent Application, Serial No. 19168170.9, filed Apr. 9, 2019, pursuant to 35 U.S.C. 119(a)-(d).

BACKGROUND OF THE INVENTION

The invention relates to a heat transfer apparatus and an electrical or electronic component.

Electrical or electronic components can be part of an integrated circuit that is arranged on a carrier plate. In this case, the electrical or electronic components, such as for example a resistor or a power semiconductor, generate heat that cannot be sufficiently dissipated by way of the carrier plate. Therefore, cooling plates are known in the prior art which are arranged between the electrical/electronic component and the carrier plate or on the carrier plate so as to provide a thermal coupling in order to conduct heat away from the electrical/electronic component.

The power density and an associated permissible area of application of electrical/electronic components are limited by the so-called barrier layer temperature of semiconductor elements from which the electrical or electronic components are formed. A maximum permissible temperature therefore limits the use and construction of the electrical or electronic component. Furthermore, high temperature fluctuations reduce the serviceable life of semiconductor elements and their connection and consequently reduce the serviceable life of the entire electrical or electronic component. Therefore, the thermal connection to the electrical and electronic component and in particular to its semiconductor element is of great importance. The thermal connection is in particular influenced by the following parameters: Variable of the cooling and contact area with respect to the electrical and electronic component, material parameter (e.g. thermal conduction coefficient), the heat transfer coefficient and the temperature difference between heat source (for example the semiconductor element of the electrical and electronic component) and heat sink (for example cooling element).

In order to improve the thermal connection, it is therefore known to spread the heat that arises on the electrical and electronic component over a large area. For this purpose, a heat transfer apparatus is known, which comprises a central heat chamber, in particular a steam chamber, from which symmetrical microchannels lead off and which operate according to the principle of a pulsating heating structure (heat-pipe principle) as a result of pumped cooling. Such a heat transfer apparatus is described for example in the International Journal of Heat and Mass Transfer 81, 2015, Pages 33 to 40 Article: "Heat transfer performance of a fractal silicon microchannel heat sink subjected to pulsation flow" by S. Xu et al. (Shanglong Xu, Weijie Wang, Juang Fang, Chun-Nam Wong), journal homepage: www.elsevier.com/locate/ijhmt.

In this case, if there is too much fluid within the heat chamber, the pulsating heating structure is unable to start. If there is too much steam within the heat chamber, the electrical and electronic component can overheat.

The publication U.S. Pat. No. 5,937,936 discloses a heat sink for a portable electronic device, in which a fluid Is evaporated in a heat receiving area, the heat is transported by the heat pipe into other areas, liquefied back to its previous state and returned to the heat receiving area.

The object of the invention is to provide a heat transfer apparatus that renders it possible in a reliable manner to transfer and dissipate heat, in particular to render it possible to reliably start the heat transfer apparatus.

SUMMARY OF THE INVENTION

The object is achieved in accordance with the invention by a heat transfer apparatus as set forth hereinafter. With respect to the electronic component, the object is achieved as set forth hereinafter.

Developments of the Invention are the subject matter of the dependent claims.

The heat transfer apparatus comprises in accordance with the invention at least one heat dissipating structure and at least one heat chamber, in particular a hot chamber, wherein the heat dissipating structure and the heat chamber are coupled to a closed thermal circuit, wherein the heat dissipating structure comprises an outlet channel that leads off from the heat chamber and that issues at an end that is remote from the heat chamber into at least one return duct and wherein the return duct is dimensioned smaller than the outlet channel and issues into the heat chamber.

In this case, the at least one heat chamber or hot chamber is a boiling chamber or steam chamber and the at least one heat dissipating structure is a channel structure having steam areas and fluid areas, wherein the heat chamber and the heat dissipating structure together form a pulsating or oscillating heat structure mechanism (also called a pulsating heat-pipe mechanism) having a two-phase flow.

In the case of the pulsating heat structure mechanism (pulsating heat-pipe mechanism) the fluid, such as a cooling medium, is guided and returned in a pulsating or oscillating manner, by means of capillary forces in the channels, such as the outlet channel and the return channel, a heat pipe or a so-called pulsating heat-pipe. The pulsating heat structure mechanism represents an efficient heat transport possibility. In this case, for example, the fluid, in particular a cooling medium, for example water, acetone, methanol or ethanol, evaporates at the site where the heat is received in the region of a heat absorption of the fluid, for example in the heat chamber, and consequently in the region of a power element of the electrical and electronic component and condenses for example at the site where the heat Is discharged for example already in the heat chamber and/or of the heat dissipating structure, in particular of a symmetrical or asymmetrical channel structure. Therefore, a heat transport is generated by exploiting de-icing, evaporation, vaporization or any kind of phase change. The absorption of heat into the fluid leads to an increase in the energy level of the fluid, in particular the pressure in the thermal circuit and as a result thereof to a phase transition of the fluid, for example from solid to liquid or from a liquid to a gaseous state or conversely.

Consequently, the fluid, such as a cooling medium or agent, is present in two phases in the closed circuit. Furthermore, the heat dissipating structure, in particular a channel structure, for example a microchannel structure or capillary structure, is arranged in a symmetrical manner around the heat chamber. Furthermore, the heat chamber and the heat dissipating structure are initially evacuated and subsequently filled in part with the fluid, a cooling medium.

As a consequence, two phases are already present at the commencement of an operation of the heat transfer apparatus.

Such a heat transfer apparatus having such a heat dissipating structure in the form of a channel structure, in particular a microchannel structure or capillary structure is characterized by a heat sink having a large heat transfer area, wherein in the case of a pulsating or oscillating flow of a fluid, such as a cooling medium, it is possible to achieve a convective heat transfer using the heat dissipating structure. The configuration of a larger dimensioned outlet channel, which leads off from the heat chamber or hot chamber, renders possible an improved division and dissipation of a heat flow from the heat chamber, as a result of which the heat transport is improved.

A further aspect provides that the outlet channel at the end that Is remote from the heat chamber is divided into at least two or more return channels that are dimensioned in each case smaller than the outlet channel and which issue separately from one another into the heat chamber. Such a configuration and division of the heat flow of the outlet channel into two or more return channels renders possible an improved heat transport and improved condensation. In this case, the return channels and the outlet channel are configured in such a manner that the mass flow of the outlet channel Is equal to the sum of the part mass flows of the return channels.

A further aspect provides that the smaller return channels in the region of an outer edge of the heat transfer apparatus are divided fractually or further branched, in particular Into further part return channels. This produces a flow division with a minimum pressure lost whilst simultaneously making maximum use of the area and maximum spread over the area. This leads to an Improved condensation in the return ducts and consequently an improved heat transfer.

A further possible embodiment provides that the outlet channel and the at least one return channel lie in one plane. This renders possible a flat construction of the heat transfer apparatus.

An alternative embodiment provides that the outlet channel runs in at least a first plane and the at least one return channel runs in at least one second plane that is offset with respect to the first plane. In other words: the return channel or the return channels are routed back one or more planes deeper. As a consequence, a heat dissipating structure having at least two or more channel structures that lie one above the other—at least one upper outlet channel structure and at least one return channel structure lying below it. Furthermore, further fractal and/or three-dimensional geometries are possible for the heat dissipating structure. Such a three-dimensional geometry for the heat transfer apparatus renders possible an Integration in particular a thermal coupling of the heat transfer apparatus with a rib structure of a component that is to be cooled.

A simple embodiment provides that an inner diameter of the outlet channel is greater than an inner diameter of the at least one return channel. This renders possible a heat transport with a minimum pressure lost whilst simultaneously making maximum use of the area and spread over the area. Furthermore, such a cross-sectional constriction renders it possible to accelerate the flow from the outlet channel into the adjoining return channel. This produces a pulsating or oscillating flow in the closed thermal circuit.

A further aspect provides that the heat chamber or hot chamber is embodied as a boiling chamber or steam chamber, which is provided on at least one or opposite-lying inner surfaces with a structure. Such an inner-side surface structure that protrudes into the heat chamber can set an optimal ratio of fluid/liquid and steam in the heat chamber. For example, the structure is embodied in such a manner that an interior space of the heat chamber, in particular of a boiling chamber or steam chamber, has a varying cross-section.

For example, an interior space of the heat chamber, in particular of a boiling chamber or steam chamber, has along its longitudinal extent, for example a horizontal extent of the heat chamber, multiple narrower cross-sections that are spaced apart from one another. Such localized changes in the cross-section, in particular a narrowing of the cross-section, such as cross-sectional constrictions, increases the so-called capillary force in the heat chamber.

In one possible embodiment, the narrower cross-sections, such as for example the cross-sectional constrictions, are formed by protrusions that lie opposite one another and protrude from Inner surfaces that lie opposite one another, such as for example interior walls, into the interior space. Such a pattern of inner structures in the interior space of the heat chamber or hot chamber facilitates the so-called start-up in the case of a frozen fluid, such as a cooling medium, for example a cooling fluid or cooling agent.

A further aspect provides that the heat transfer apparatus can comprise more than one heat chamber which are part of an Individual closed thermal circuit. Alternatively, each heat chamber can have an associated closed thermal part circuit, wherein the closed thermal part circuits can in turn be thermally coupled indirectly or directly. Alternatively the thermal part circuits can also be separate from one another. Moreover, the channels of the heat dissipating structure can be arranged in an asymmetrical manner around one or multiple heat chamber(s).

A further aspect of the Invention relates to an electrical or electronic component, that comprises a power element, in particular a power semiconductor, which is thermally coupled to a heat transfer apparatus.

In one possible embodiment, the heat transfer apparatus can be arranged below, above or within the power element. This renders possible a direct and rapid heat transfer and consequently a rapid warming of the hot power element. For example, the heat chamber is arranged below the power element parallel thereto.

The heat dissipating structure extends in this case in a radial manner away from the heat chamber and the power element in one or multiple plane(s). This renders possible an improved use of the area and spread over the area for an improved heat transport and an improved heat transport and an Improved heat transfer.

BRIEF DESCRIPTION OF THE DRAWING

The above-described characteristics, features and advantages of this invention and the manner in which these are realized are more clearly and more precisely understandable in conjunction with the following description of the exemplary embodiments that are further explained in connection with the drawings. In the drawings:

FIG. 1 shows schematically in a cross-sectional view a heat transfer apparatus that is arranged below an electrical or electronic component, FIG. 2 shows schematically in a perspective view a heat transfer apparatus having an electrical or electronic component, FIG. 8 shows schematically in a cross-sectional view a heat chamber having an innerside surface structure, FIG. 9 shows schematically in a cross-sectional view a heat chamber having an innerside surface structure and a resulting improved, in particular symmetrical, manner in which fluid is accommodated in the heat chamber, and FIG. 10 shows schematically in a cross-sectional view a conventional heat chamber without an innerside surface structure and a resulting asymmetrical manner in which fluid is accommodated in the heat chamber according to the prior art.

DETAILED DESCRIPTION OF PREFERRED EMBODIMENTS

Figure 3:
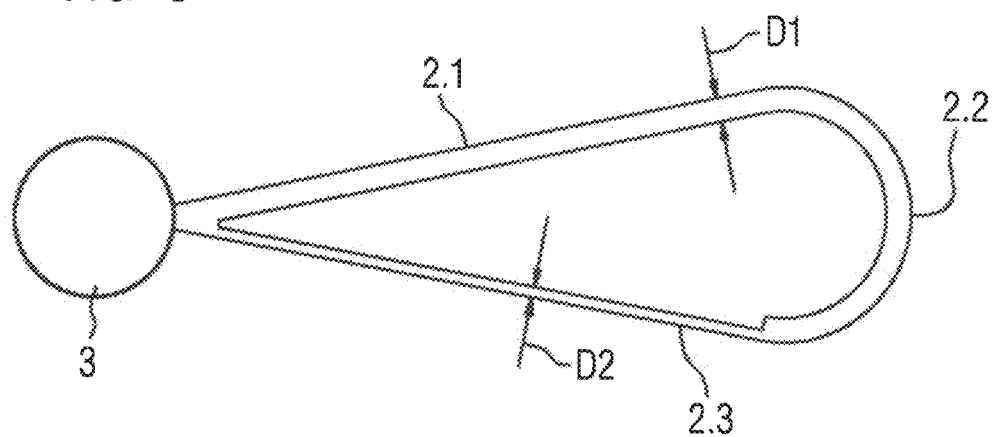
FIG. 3 shows schematically in a plan view a heat chamber having a heat dissipating structure which are connected to one another to form a closed thermal circuit.

Mutually corresponding parts are provided in all the figures with identical reference numerals.

FIG. 1 illustrates schematically in a cross-sectional view a heat transfer apparatus 1.

The heat transfer apparatus 1 comprises at least one heat dissipating structure 2 and at least one heat chamber 3.

The heat transfer apparatus 1 is arranged below an electrical or electronic component 4 (referred to below in short as component 4). Alternatively, the heat transfer apparatus 1 can be arranged above or within the component 4 (not further illustrated).

The component 4 is for example part of an integrated circuit that is in turn part of a carrier plate 5, in particular a printed circuit board. For example, the component 4 is a power element, in particular a power semiconductor element that generates heat W during operation and radiates said heat in accordance with arrow PF1.

Optionally, it is also possible to provide a cooling body 6 for dissipating heat, which is arranged for example on a side of the carrier plate 5 that lies opposite the component 4. The cooling body 6 can have ribs 6.1 for distributing and improved dissipation of the heat W, as a result of which the heat W is distributed over a large area and dissipated.

FIG. 2 illustrates schematically in a perspective view one possible embodiment for the heat transfer apparatus 1 having an electrical or electronic component 4, in particular a power semiconductor element, such as a power chip.

The heat transfer apparatus 1 comprises the heat dissipating structure 2 and the heat chamber 3 that are coupled to a closed thermal circuit 7 in which a fluid F, in particular a cooling medium, such as for example water, methanol, ethanol or acetone, flows.

The heat chamber 3 is in particular a hot chamber that is arranged directly below the component 4 and is thermally stressed by the radiating heat W of the component 4. Depending upon the amount of the radiating heat W, the fluid F that Is arranged in the heat chamber 3 can be heated up to boiling point or evaporating point, as a result of which the pressure in the thermal circuit 7 is increased and a pulsating flow S in the thermal circuit 7 having fluid phases FP or steam phases DP is adjusted without a pump. In this case, after being part filled with the fluid F, the thermal circuit 7 is in a state of thermodynamic equilibrium in which both phases—fluid phase FP and steam phase DP—are present. Localized warming increases the pressure in the thermal circuit 7. This leads to the pulsating or oscillating flow S without a pump. In this case, the fluid F can evaporate or condense in places, as a result of which the heat transport is increased. The pulsating or oscillating flow S (referred to below in short as pulsating flow S) is consequently a two-phase flow in which the fluid F Is present in the fluid phases FP and/or steam phases DP along the closed thermal circuit 7. Consequently, the heat dissipating structure 2 has steam regions 2.4 and fluid regions 2.5.

The heat chamber 3 can also be described depending upon the phase of the fluid F as a steam chamber or boiling chamber.

The heat dissipating structure 2 comprises an outlet channel 2.1 that leads off from the heat chamber 3 and issues at one end 2.2 remote from the heat chamber 3 into at least one return channel 2.3 that then issues into the heat chamber 3.

For example, the fluid F that is flowing out of the heat chamber 3 by way of the outlet channel 2.1 and the return channel 2.3 flows back into the heat chamber 3 in the form of a cooling loop 8, as a result of which the closed thermal circuit 7 is formed.

In this case, multiple cooling loops 8 can be arranged distributed in a symmetrical manner around the in particular middle or centrally arranged heat chamber 3. In particular, the cooling loops 8 have essentially identical shapes, sizes and dimensions. Alternatively, these can also be different from one another.

In this case, the return channel 2.3 is dimensioned smaller that the outlet channel 2.1, as is illustrated in detail in FIG. 3.

FIG. 3 illustrates in detail one of the cooling loops 8 of the closed thermal circuit 7 with the central heat chamber 3 and the heat dissipating structure 2, which are connected to one another to form the cooling loop 8 and consequently to form a part circuit of the closed thermal circuit 7.

The configuration of the larger dimensioned outlet channel 2.1, which leads off from the heat chamber 3, renders possible an improved division and dissipation of a heat flow from the heat chamber 3, as a result of which the heat transport is Improved.

All cooling loops 8 have for example the identical aspect that their outlet channels 2.1 are dimensioned larger than their return channels 2.3.

For example, an inner diameter D1 of the outlet channel 2.1 is larger than an inner diameter D2 of the return channel 2.3. This renders possible a heat transport with a minimum pressure lost whilst simultaneously making maximum use of the area and spread over the area. Furthermore, such a cross-sectional constriction 13 renders it possible to accelerate the flow from the outlet channel 2.1 into the adjoining return channel 2.3. This produces and supports the pulsating flow S in the closed thermal circuit 7.

Such a heat transfer apparatus 1 having such a heat dissipating structure 2 in the form of a channel structure, in particular a microchannel structure or capillary structure renders possible a heat sink having a large heat transfer area, wherein on account of the pulsating flow S of the fluid F, it is possible to achieve a convective heat transfer using the heat dissipating structure.

Figure 4:
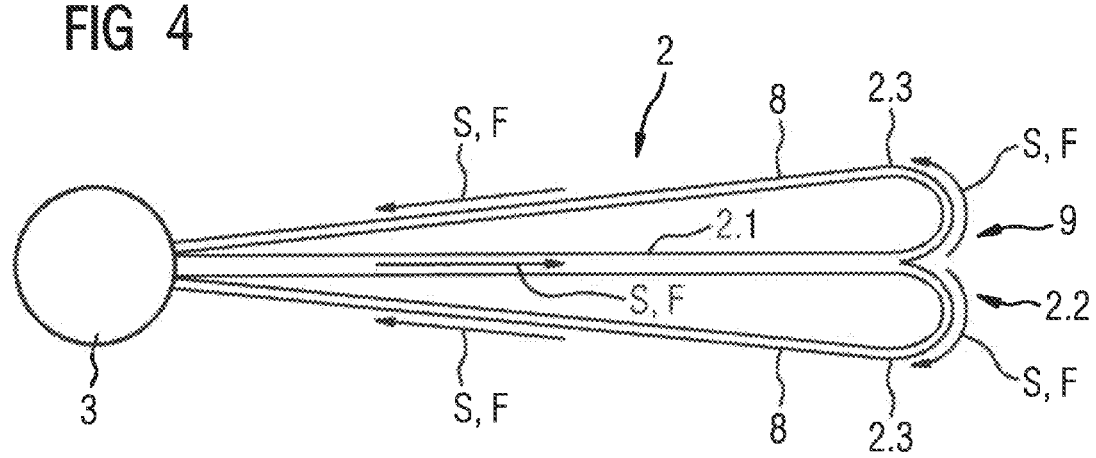
FIG. 4 to FIG. 7 show schematically in a plan view respectively a heat chamber having an alternative heat dissipating structure which are connected to one another to form a closed thermal circuit.

FIG. 4 illustrates schematically in a plan view the heat chamber 3 having an alternative heat dissipating structure 2 in the form of a dual cooling loop 9, formed from two Individual cooling loops 8.

In this case, the outlet channel 2.1 at the end 2.2 that is remote from the heat chamber 3 divides into at least two return channels 2.3 that are each dimensioned smaller than the outlet channel 2.1 and which issue separately from one another into the heat chamber 3. Consequently, two cooling loops 8 are formed, which are formed by the one common outlet channel 2.1 and the two divided return channels 2.3. The common outlet channel 2.1 is in this case dimensioned larger than the two leading-off return channels 2.3. In particular, the common outlet channel 2.1 has a larger inner diameter D1 than the respective inner diameter D2 of the return channels 2.3. In this case, the return channels 2.3 have essentially identical shapes, sizes and dimensions. In particular, the inner diameter D2 of the return channels 2.3 are identical.

Such a configuration and division of the pulsating or oscillating flow S from the outlet channel 2.1 into two or more return channels 2.3 renders possible an improved heat transport and improved condensation. In this case, the return channels 2.3 and the common outlet channel 2.1 are configured in such a manner that the mass flow of the outlet channel 2.1 is equal to the sum of the part mass flows of the return channels 2.3.

Figure 5:
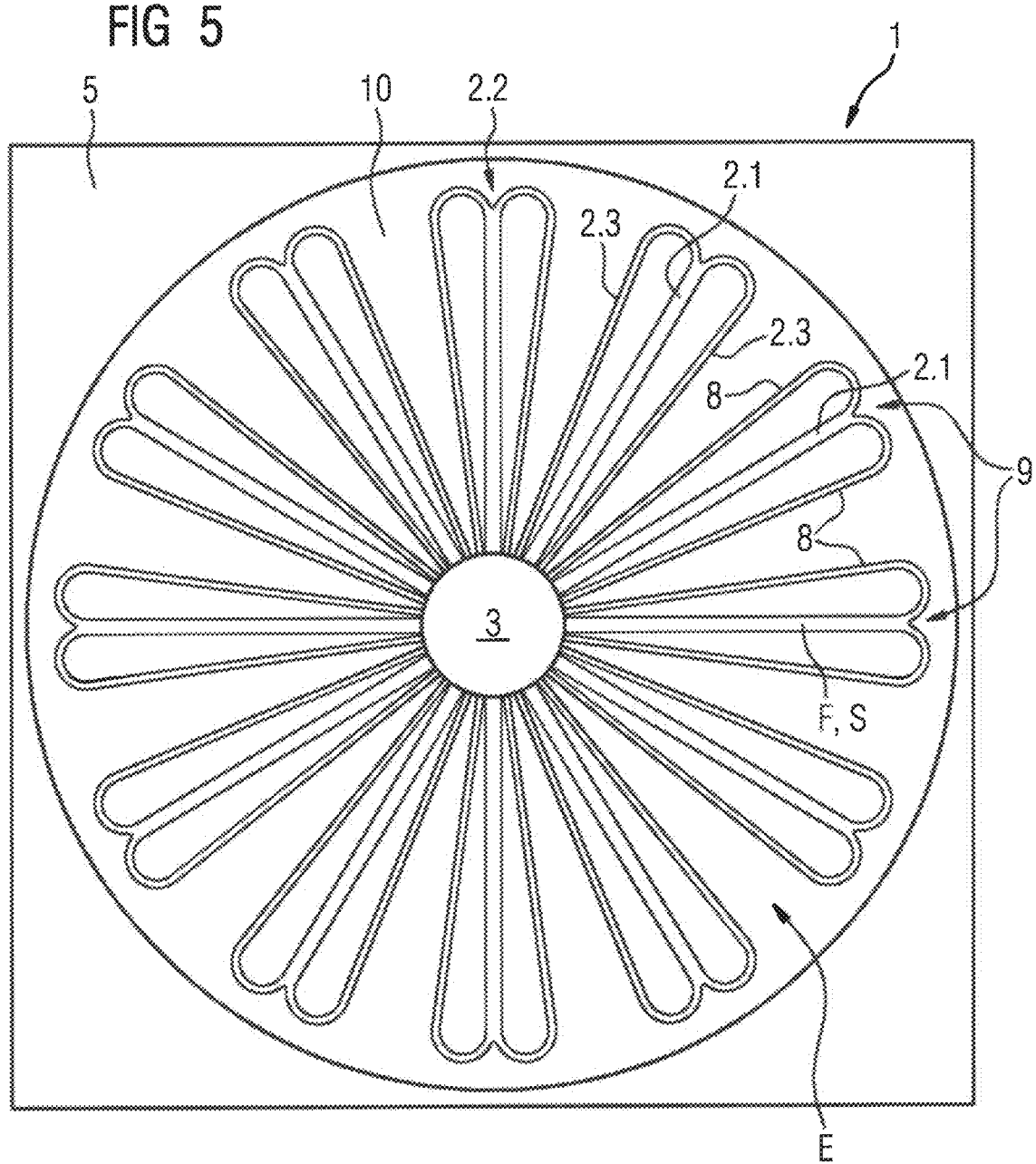

FIG. 5 illustrates in detail the heat transfer apparatus 1 with multiple dual cooling loops 9 in accordance with FIG. 4 arranged distributed symmetrically around the heat chamber 3. The heat transfer apparatus 1 is for example arranged on a base plate 10 that Is arranged on the carrier plate 5. Depending upon the embodiment, the base plate 10 and the carrier plate 5 can be a component 4 or separate components 4.

Figure 6:
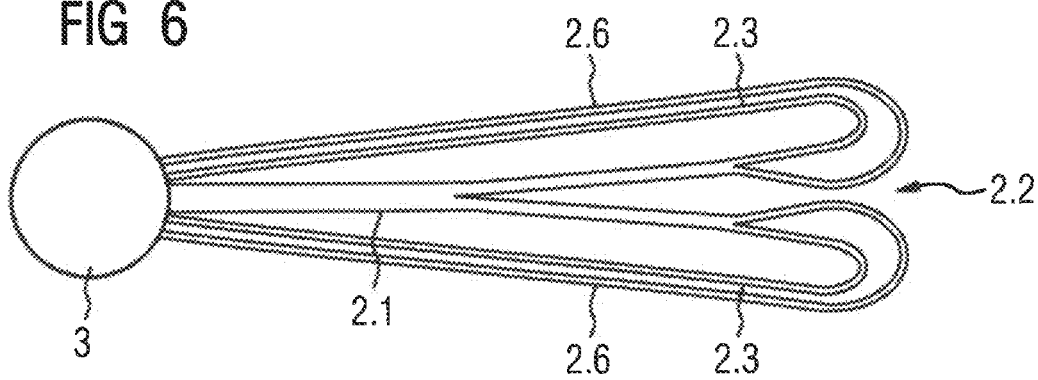

FIG. 6 illustrates schematically in a plan view the heat chamber 3 having an alternative heat dissipating structure 2 in the form of a fractal division of the return channels 2.3 into further part return channels 2.6.

In this case, the common outlet channel 2.1 initially divides into two return channels 2.3, from which in each case one-part return channel 2.6 leads off. The channel is divided at the end 2.2 of the heat dissipating structure 2 which is remote from the heat chamber 3. Such a fractal channel division renders it possible to divide the flow with a minimum pressure lost whilst simultaneously making maximum use of the area and spread over the area.

In the case of different embodiments of the heat transfer apparatus 1 according to FIGS. 1 to 6, the heat dissipating structure 2 is arranged in one plane E. In other words, the outlet channels 2.1 and the return channels 2.3 run in the same plane E.

Figure 7:
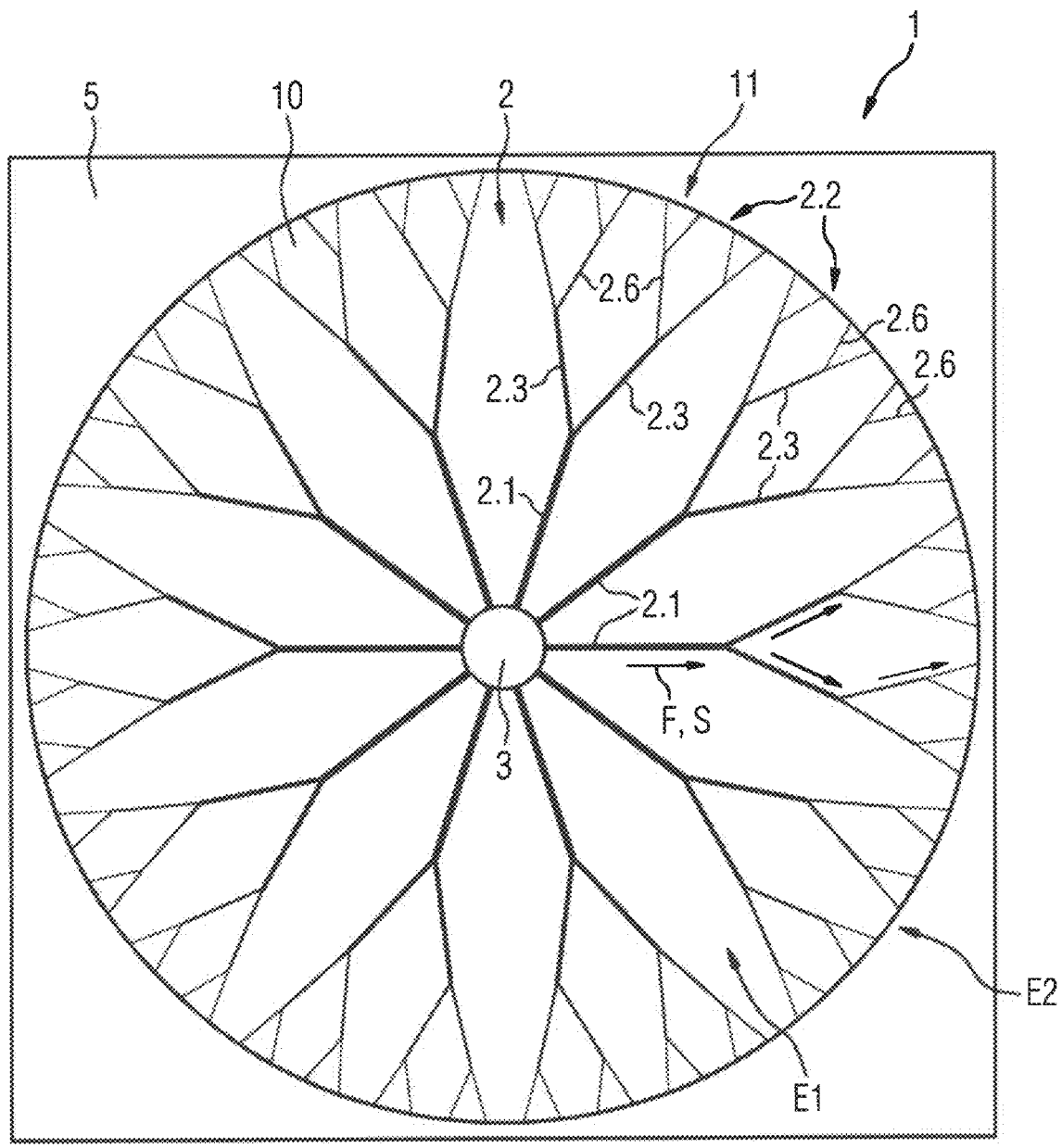

FIG. 7 illustrates schematically in a plan view a further alternative embodiment for a heat transfer apparatus 1 having a heat dissipating structure 2 that runs in two planes E1, E2. For example, the outlet channels 2.1 run in a first plane E1 and the return channels 2.3, which lead off from the outlet channels 2.1, and the part return channels 2.6 that in turn lead off from the return channels 2.3 run in a second plane E2 that is offset with respect to the first plane E1.

In other words: The return channel or return channels 2.3 and part return channels 2.6 are guided back in the second plane E2 that is deeper than the first plane E1. As a consequence, a heat dissipating structure 2 having at least two channel structures that lie one above the other—an upper outlet channel structure and a return channel structure lying below it, is developed. In this case, further fractal and/or three-dimensional geometries are possible for the heat dissipating structure 2. FIG. 7 illustrates the heat dissipating structure 2 in the form of a capillary channel structure 11 having greatly branched return channels 2.3 and part return channels 2.6 that are dimensioned smaller than the respective outlet channel 2.1.

All the embodiments according to FIGS. 1 to 7 have the identical aspect that the heat dissipating structure 2 extends in a radial manner away from the heat chamber 3, wherein the heat chamber 3 is arranged below the component 4.

FIG. 8 illustrates schematically in a cross-sectional view the heat chamber 3 having a structure 12. The structure 12 is provided in the form of a surface structure on at least one or on opposite-lying inner surface structures 3.1 of the heat chamber 3.

The structure 12 is an innerside surface structure that protrudes into the heat chamber 3. For example, the structure 12 is embodied in such a manner that an interior space 3.2 of the heat chamber 3 has a varying cross-section.

For example, the interior space 3.2 can have multiple cross-sectional constrictions 12 along a longitudinal extent. The cross-sectional constrictions 13 are formed for example by protrusions 3.3 that protrude into the inner space 3.2, said protrusions being for example ribs, knobs, ridges. In this case, the protrusions 3.3 are arranged in pairs, wherein one pair of protrusions 3.3 protrude from opposite-lying inner surfaces 3.1 into the interior space 3.2. In this case, the pairs of protrusions 3.3 protrude into the interior space 3.2 in such a manner that their free protruding ends are spaced apart from one another, as a result of which one of the cross-sectional constrictions 13 is formed in the interior space 3.2. Such localized cross-sectional constrictions 13 increase the so-called capillary effect of the fluid F in the channels of the closed thermal circuit 7.

FIG. 9 illustrates schematically in a cross-sectional view the heat chamber 3 having the innerside surface structure 12 and a resulting Improved, in particular symmetrical, manner in which fluid is accommodated in the heat chamber 3. The cross-sectional constrictions 13 increase the capillary effect of the fluid F in the heat chamber 3 with the result that fluid F is present in the region of the respective cross-sectional constriction 13 as a fluid phase FP.

Such a pattern of inner structures 12 in the interior space 3.2 of the heat chamber 3 results in the fluid being accommodated in a symmetrical manner in the heat chamber 3 and consequently facilitates the so-called start-up of the heat transfer apparatus 1 and the pulsating heating structure mechanism in the case of a frozen fluid F in the start phase.

FIG. 10 illustrates schematically in a cross-sectional view a conventional heat chamber 3 without an innerside surface structure 12 and a resulting asymmetrical manner in which fluid is accommodated within the heat chamber 3 according to the prior art.

Although the invention has been further illustrated and described in detail with the aid of preferred exemplary embodiments, the invention is not limited by the disclosed examples and other variations can be derived therefrom by the person skilled in the art without abandoning the protective scope of the invention.

What is claimed is:
1. A heat transfer apparatus, comprising:
a heat chamber; and
a heat dissipating structure coupled to the heat chamber so as to jointly form a closed thermal circuit, said heat dissipating structure comprising an outlet channel that leads off from the heat chamber and issues at an end that is remote from the heat chamber into a return duct which issues into the heat chamber, said return duct having a dimension which is smaller than a dimension of the outlet channel,
wherein the heat chamber is a boiling chamber or a steam chamber and the heat dissipating structure is a channel structure having steam regions and fluid regions, and
wherein the heat chamber and the heat dissipating structure together form a pulsating or oscillating heating structure mechanism.

2. The heat transfer apparatus of claim 1, wherein the outlet channel at the end that is remote from the heat chamber divides into at least two of said return channel which are each dimensioned smaller than the outlet channel and which issue separately from one another into the heat chamber.

3. The heat transfer apparatus of claim 1, wherein the outlet channel and the return channel lie in a plane.

4. The heat transfer apparatus of claim 1, wherein the outlet channel runs in a first plane and the return channel runs in a second plane that is offset with respect to the first plane.

5. The heat transfer apparatus of claim 1, wherein the outlet channel has an inner diameter which is larger than an inner diameter of the return channel.

6. The heat transfer apparatus of claim 1, wherein the heat chamber is provided on at least one inner upper surface or opposite-lying inner upper surfaces with a structure.

7. The heat transfer apparatus of claim 6, wherein the structure is embodied in such a manner that an interior space of the heat chamber has a varying cross-section.

8. The heat transfer apparatus of claim 6, wherein the structure is embodied in such a manner that an interior space of the heat chamber has multiple cross-sectional constrictions along a longitudinal extent.

9. The heat transfer apparatus of claim 8, wherein the cross-sectional constrictions are formed by opposite lying protrusions that protrude from opposite lying inner surfaces into the interior space.

10. The heat transfer apparatus of claim 1, wherein the heat dissipating structure is arranged in a symmetrical or asymmetrical manner around the heat chamber.

11. An electrical or electronic component, comprising a power element thermally coupled to a heat transfer apparatus, said heat transfer apparatus, comprising a heat chamber, and a heat dissipating structure coupled to the heat chamber so as to form a closed thermal circuit, said heat dissipating structure comprising an outlet channel that leads off from the heat chamber and issues at an end that is remote from the heat chamber into a return duct which issues into the heat chamber, said return duct having a dimension which is smaller than a dimension of the outlet channel, wherein the heat chamber is a boiling chamber or a steam chamber and the heat dissipating structure is a channel structure having steam regions and fluid regions, and wherein the heat chamber and the heat dissipating structure together form a pulsating or oscillating heating structure mechanism.

12. The electrical or electronic component of claim 11, wherein the power element is a power semiconductor element.

13. The electrical or electronic component of claim 11, wherein the heat transfer apparatus is arranged below, above or within the power element.

14. The electrical or electronic component of claim 11, wherein the heat chamber is arranged below, above or within the power element.

15. The electrical or electronic component of claim 11, wherein the heat dissipating structure extends in a radial direction away from the heat chamber and the power element in one or multiple planes.

* * * * *

UNITED STATES PATENT AND TRADEMARK OFFICE
CERTIFICATE OF CORRECTION

PATENT NO. : 11,503,747 B2
APPLICATION NO. : 17/602589
DATED : November 15, 2022
INVENTOR(S) : Florian Schwarz Page 1 of 1

It is certified that error appears in the above-identified patent and that said Letters Patent is hereby corrected as shown below:

On the Title Page

Under [73] Assignee:
Replace "SIEMENS AKTIENGESSSCHAFT" with the correct -- SIEMENS AKTIENGESELLSCHAFT --.

Signed and Sealed this
Third Day of January, 2023

Katherine Kelly Vidal
*Director of the United States Patent and Trademark Office*